United States Patent
Sugiyama et al.

[11] Patent Number: 6,020,036
[45] Date of Patent: Feb. 1, 2000

[54] METHOD OF FORMING HARD CARBON FILM OVER THE INNER SURFACE OF GUIDE BUSH

[75] Inventors: Osamu Sugiyama, Tokorozawa; Yukio Miya, Kawagoe; Ryota Koike, Tokorozawa; Takashi Toida, Tokyo; Toshiichi Sekine, Kamifukuoka, all of Japan

[73] Assignee: Citizen Watch Co., Ltd., Tokyo, Japan

[21] Appl. No.: 09/051,636

[22] PCT Filed: Aug. 19, 1997

[86] PCT No.: PCT/JP97/02868

§ 371 Date: Apr. 16, 1998

§ 102(e) Date: Apr. 16, 1998

[87] PCT Pub. No.: WO98/07895

PCT Pub. Date: Feb. 26, 1998

[30] Foreign Application Priority Data

Aug. 19, 1996 [JP] Japan ..................................... 8-217351

[51] Int. Cl.[7] ............................... B05D 3/06; B05D 7/22; C23C 16/26
[52] U.S. Cl. ..................... 427/577; 427/249.7; 427/237; 427/238; 427/239; 427/902; 427/904
[58] Field of Search ................................ 427/577, 249.7, 427/239, 238, 237, 902, 904

[56] References Cited

U.S. PATENT DOCUMENTS

| | | | |
|---|---|---|---|
| 4,746,538 | 5/1988 | Mackowski | 427/38 |
| 5,521,351 | 5/1996 | Mahoney | 219/121.59 |
| 5,879,763 | 3/1999 | Sugiyama et al. | 427/577 |

FOREIGN PATENT DOCUMENTS

| | | |
|---|---|---|
| 57-56217 | 9/1955 | Japan . |
| 62-74068 | 4/1987 | Japan . |
| 62-167822 | 7/1987 | Japan . |
| 62-180077 | 8/1987 | Japan . |
| 63-36521 | 2/1988 | Japan . |
| 2-70059 | 3/1990 | Japan . |
| 4-123424 | 4/1992 | Japan . |
| 4-141303 | 5/1992 | Japan . |
| 4-198484 | 7/1992 | Japan . |
| 5-109695 | 4/1993 | Japan . |
| 7-252663 | 10/1995 | Japan . |

*Primary Examiner*—Roy V. King
*Attorney, Agent, or Firm*—Armstrong, Westerman, Hattori, McLeland & Naugton

[57] ABSTRACT

A guide bush (11), coming in sliding contact with a workpiece, for use in an automatic lathe is placed in a vacuum vessel (61), and after inserting an auxiliary electrode (71), which is grounded or to which a positive DC voltage is applied, in the center bore (11*j*) of the guide bush (11), forming the inner surface (11*b*) thereof, the vacuum vessel (61) is evacuated such that an initially reached pressure therein is not higher than a predetermined degree of vacuum. Then, after a DC voltage is applied to an anode (79) and an AC voltage is applied to a filament (81) while applying a DC voltage to the guide bush (11), carbon-containing gas is fed into the vacuum vessel (61), producing a plasma therein and the pressure inside the vacuum vessel (61) is controlled to attain a film-forming pressure higher than the initially reached pressure while forming a hard carbon film over the inner surface of the guide bush (11) by means of a plasma CVD process.

12 Claims, 9 Drawing Sheets

METHOD OF FORMING HARD CARBON FILM OVER THE INNER SURFACE OF GUIDE BUSH

This application is a national stage of PCT/JP97/02868 filed Aug. 19, 1997.

TECHNICAL FIELD

The present invention relates to a method of forming a hard carbon film over an inner surface of a guide bush for supporting a rod-like workpiece for rotation and axial sliding at a position near a cutting tool (cutter), mounted on an automatic lathe, the inner surface coming in sliding contact with the workpiece.

BACKGROUND TECHNOLOGY

Guide bushes mounted on the column of an automatic lathe to hold a rod-like workpiece rotatably at a position near a cutting tool are classified into a rotary type and a stationary type. The rotary guide bush rotates together with a workpiece and holds the workpiece for axial sliding while the stationary guide bush remains stationary and holds a workpiece for rotation and axial sliding without rotating itself.

The guide bush of either type has a taper outer surface, a portion provided with slits for affording elasticity to the portion, a threaded portion for mounting the guide bush on the column, and an inner surface for holding a workpiece. The inner surface constantly in sliding contact with the workpiece is susceptible to wear and, particularly, the inner surface of the stationary guide bush undergoes intense wear.

A guide bush proposed in, for example, JP-A No. 4-141303 has an inner surface, coming in sliding contact with a workpiece making sliding and rotative movement, securely attached with a superhard alloy or a ceramic material by brazing or the like.

When the inner surface of a guide bush is attached with a superhard alloy or a ceramic material excellent in wear resistance and heat resistance, the wear of the inner surface of the guide bush can be reduced to some extent.

However, when the workpiece is subjected to heavy machining on an automatic lathe, in which the depth of cut is large and the cutting speed is high, the workpiece is damaged or seizure occurs due to a decrease in a clearance in the radial direction between the guide bush and the workpiece even if the inner surface of the gude bush is attached with the superhard alloy or the ceramic material because the superhard alloy and the ceramic material have a comparatively large coefficient of friction and a low thermal conductivity. Therefore, it has been difficult to increase the depth of cut and cutting speed.

The stationary guide bush has advantages in that a workpiece can be accurately machined in a high roundness because the workpiece can be held such that its axis has no runout, less noise is generated, and the construction of the automatic lathe may be made simpler and compact.

However, the inner surface of the stationary guide bush is worn far more rapidly than that of the rotary guide bush and hence, it has been difficult to increase further the depth of cut and the cutting speed when the stationary guide bush is employed.

For solving such problems, a proposal has been made to provide a guide bush wherein wear resistance of an inner surface thereof, in sliding contact with a workpiece, is dramatically enhanced by forming a hard carbon film over the inner surface, enabling an automatic lathe to machine a workpiece with an increased depth of cut and at a higher cutting speed without damaging the workpiece or causing seizure between the guide bush and the workpiece.

The hard carbon film is formed of hydrogenated amorphous carbon having properties closely resembling those of diamond. Therefore, the hydrogenated amorphous carbon is also called diamond like carbon (DLC).

The hard carbon film (DLC film) has high hardness (not lower than Vickers 3000 Hv), excellent wear resistance, a small coefficient of friction (about ⅛ that of a superhard alloy), and excellent corrosion resistance.

For example, a plasma CVD process as described hereinafter is available as a method of forming the hard carbon film over the inner surface of the guide bush.

More specifically, in carrying out the process, a vacuum vessel is evacuated so as to reach a degree of vacuum not higher than $3 \times 10^{-5}$ torr (such a pressure as reached initially is referred hereinafter as "an initially reached pressure") after disposing the guide bush inside the vacuum vessel.

Then, a carbon-containing gas is fed into the vacuum vessel, and the pressure therein is regulated to be $5 \times 10^{-3}$ torr, which is a film-forming pressure.

Subsequently, a DC voltage at −3 kV is applied to the guide bush and a DC voltage is applied to an anode, disposed opposite to the guide bush, and an AC voltage is applied to a filament, respectively, causing a plasma to be produced inside the vacuum vessel, and forming a hard carbon film over the surface of the guide bush by the agency of the carbon plasma.

However, with the plasma CVD process described above, the hard carbon film is formed primarily by the agency of the plasma produced in a region surrounding the guide bush, decomposing the carbon-containing gas, and therefore, a problem will arise that although the hard carbon film can be formed uniformly over the outer surface of the guide bush, the hard carbon film formed over the inner surface of the guide bush has a poor adhesion property and is inferior in film qualities such as hardness and the like.

This is attributable to a phenomenon that an unintended electric discharge, called a hollow cathode discharge, is caused to occur in the center bore of the guide bush by the plasma produced therein because the center bore occupies a space wherein electrodes at the same electric potential face each other. The hard carbon film formed by the hollow cathode discharge is a polymer-like film poor in adhesion property, prone to be easily exfoliated from the inner surface of the guide bush, and having low hardness.

Further, in the method of forming the hard carbon film as described above, a DC voltage at −3 kV is applied to the guide bush from a DC power source when the pressure is at $5 \times 10^{-3}$ torr, which is the film-forming pressure.

In such a condition wherein the pressure in the vacuum vessel is on the order of $5 \times 10^{-3}$ torr, the space within the vacuum vessel is full of electric charges such as electrons, lowering the impedance of the space. As a result, the moment a plasma discharge starts, an unintended electric discharge such as an arc discharge is apt to occur.

Further, since the time when the plasma discharge starts corresponds to an initial stage of the hard carbon film formation, adherence of the hard carbon film to the guide bush is dependent on the quality of the film formed at the initial stage of the hard carbon film formation.

Consequently, if the unintended electric discharge, such as the arc discharge, occurs at the outset of the plasma discharge, the quality and adherence of the hard carbon film will be degraded, causing a problem of the film being exfoliated from the inner surface of the guide bush.

It is therefore an object of the invention to provide a method capable of forming a hard carbon film of high quality and excellent adhesive property over the inner surface of the guide bush, which will come in sliding contact with workpieces, by solving the problems described above.

DISCLOSURE OF THE INVENTION

To achieve the object described above, the present invention provides a method of forming a hard carbon film over the inner surface of a guide bush comprising:

a first step of placing a guide bush for use in an automatic lathe in a vacuum vessel having an evacuation port and a gas inlet port, and provided with an anode and a filament therein, and also inserting an auxiliary electrode, which is grounded or to which a positive DC voltage is applied, in a center bore of the guide bush, defined by the inner surface thereof, coming in sliding contact with a workpiece;

a second step of evacuating the vacuum vessel such that an initially reached pressure therein is not higher than a predetermined degree of vacuum;

a third step of applying a DC voltage to the anode and an AC voltage to the filament while applying a DC voltage to the guide bush; and a fourth step of supplying carbon-containing gas into the vacuum vessel through the gas inlet port, producing a plasma therein and controlling a pressure inside the vacuum vessel to attain a film forming pressure higher than the initially reached pressure while forming a hard carbon film over the inner surface of the guide bush by means of a plasma CVD process.

Alternatively, a vacuum vessel without an anode and a filament provided therein may be used, and the third step described above may be substituted by a step of applying RF power or a DC voltage to the guide bush.

In the fourth step described above, methane or benzene may be used as the carbon-containing gas fed into the vacuum vessel.

With the method of forming the hard carbon film over the inner surface of the guide bush according to the invention, the auxiliary electrode is inserted in the center bore of the guide bush disposed within the vacuum vessel, and grounded, or a positive DC voltage is applied thereto. Consequently, the plasma is uniformly produced in sufficient amounts throughout the center bore of the guide bush as well.

Furthermore, in the method according to the invention, a negative DC voltage or RF power is applied to the guide bush before the carbon-containing gas is fed into the vacuum vessel, and a pressure therein is gradually increased from the initially reached pressure to the film-forming pressure after introducing the carbon-containing gas into the vacuum vessel, causing a plasma discharge to be started at a pressure lower than the film-forming pressure. That is, the plasma discharge is started when an impedance of the space within the guide bush is higher than that at the time of the film-forming pressure, precluding occurrence of the unintended arc discharge in an initial stage of the hard carbon film formation.

It follows that the unintended discharge such as an arc discharge does not occur inside the guide bush at the outset of the plasma discharge, having vital effects on the quality of the hard carbon film formed, and a hard carbon film having an excellent adhesion property can be formed over the inner surface of the guide bush. As a result, there will not be observed a phenomenon in which the hard carbon film formed is exfoliated from the guide bush.

Further, with the use of a mixed gas of argon and either methane, or benzene as the carbon-containing gas, a negative DC voltage or RF power applied to the guide bush can be lowered and a pressure at which the plasma discharge starts can also be lowered because argon has characteristics of causing electric discharge to be started at a lower voltage (lower ionization potential) and plasma discharge to be started at a lower pressure in comparison with the case of methane or benzene. This will contribute further to inhibiting occurrence of the arc discharge at the moment the plasma discharge starts.

In addition, in the fourth step described above, the mixed gas of argon and either methane or benzene may be fed into the vacuum vessel initially as the carbon-containing gas, causing a plasma to be produced, and then only a methane gas or benzene gas can be fed therein after the stabilization of the plasma. In this way, the occurrence of the arc discharge at the start of the plasma discharge can be effectively restrained by the agency of argon, and the speed at which the hard carbon film is formed can be increased by relieving such a restraint after the stabilization of the plasma.

BEST MODE FOR CARRYING OUT THE INVENTION

Preferred embodiments of a method of forming a hard carbon film over the inner surface of a guide bush according to the present invention will be described hereinafter with reference to the accompanying drawings.

Description of an Automatic Lathe Employing a Guide Bush

The construction of an automatic lathe employing a guide bush to which the method of the present invention is applied will be briefly described hereinafter.

Figure 13:
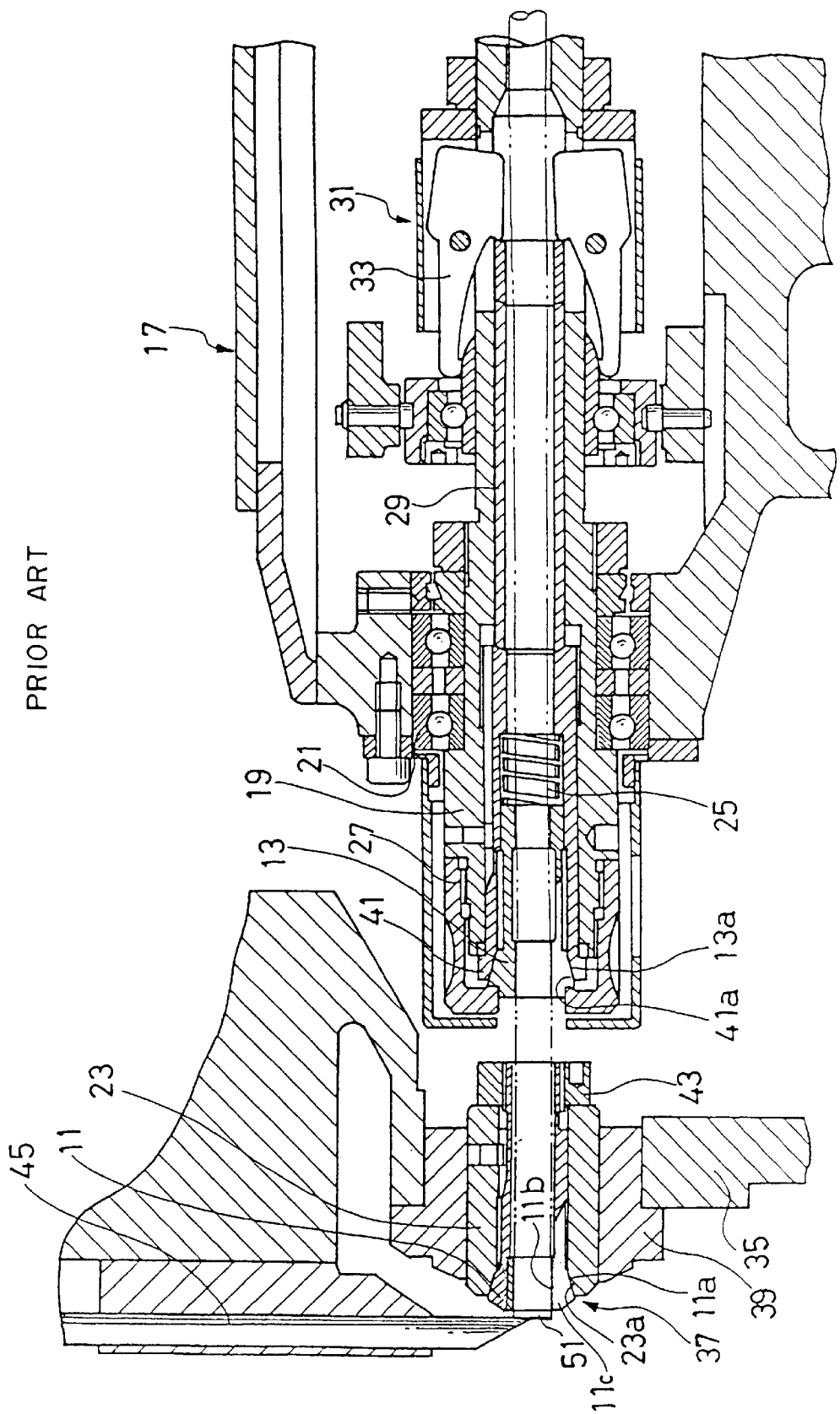
FIG. 13 is a sectional view of only a spindle and associated parts of an automatic lathe provided with a stationary guide bush unit employing the guide bush.

FIG. 13 is a sectional view showing only a spindle and associated parts of a numerically controlled automatic lathe.

The automatic lathe is provided with a stationary guide bush unit 37 to which a guide bush 11 is fixedly attached to hold a workpiece 51 (indicated by imaginary lines) rotatably on an inner surface 11b of the guide bush 11 and which is used in such a state.

A spindle stock 17 is mounted on a bed, not shown, of the numerically controlled automatic lathe so as to be slidable from side to side, as viewed in FIG. 13.

A spindle 19 is supported for rotation via bearings 21 by the spindle stock 17, and a collect chuck 13 is mounted on the nose of the spindle 19.

The collect chuck 13 having a coned head having a taper outer surface 13a is inserted in the center bore of a chucking sleeve 41 with the taper outer surface 13a in close contact with a taper inner surface 41a formed in the chucking sleeve 41.

A spring 25 formed of a spring band in coil form is inserted in an intermediate sleeve 29 at the back end of the collect chuck 13. The collect chuck 13 can be pushed out of the intermediate sleeve 29 by the action of the spring 25.

The position of the front end of the collect chuck 13 is determined by a cap nut 27 fastened to the front end of the spindle 19 with screws and in contact with the front end of the collect chuck 13. The cap nut 27 restrains the collect chuck 13 from being pushed out of the intermediate sleeve 29 by the force of the spring 25.

A chuck operating mechanism 31 provided with chuck operating levers 33 is provided on the back end of the intermediate sleeve 29. The chuck operating levers 33 are opened and closed so that the collect chuck 13 are opened and closed to release and chuck the workpiece 51.

That is, when the chuck operating levers 33 of the chuck operating mechanism 31 are shifted such that the tips thereof are moved away from each other, a portion of the chuck operating levers 33, in contact with the intermediate sleeve 29, is caused to move to the left, as viewed in FIG. 13, pushing the intermediate sleeve 29 to the left. Consequently, the chucking sleeve 41 in contact with the left end of the intermediate sleeve 29 moves to the left.

The collect chuck 13 is restrained from being pushed out of the spindle 19 by the cap nut 27 fastened to the front end of the spindle 19 with screws.

Therefore, when the chucking sleeve 41 is moved to the left, the taper inner surface 41a of the chucking sleeve 41 is pressed against the taper outer surface 13a of the slitted head portion of the collect chuck 13 and the taper inner surface 41a of the chucking sleeve 41 and the colet chuck 13 move along the taper surfaces each other.

Consequently, the collect chuck 13 is compressed and the inside diameter of the collect chuck 13 is reduced so as to be able to grip the workpiece 51.

When releasing the workpiece 51 from the collect chuck 13 by increasing the inside diameter of the collect chuck 13, the chuck operating levers 33 are shifted such that the tips thereof are moved toward each other, eliminating a force acting to move the chucking sleeve 41 to the left.

Then, the intermediate sleeve 29 and the chucking sleeve 41 are moved to the right as viewed in FIG. 13 by the resilience of the spring 25.

Consequently, the pressure applied to the taper outer surface 13a of the collect chuck 13 by the taper inner surface 41a of the chucking sleeve 41 is removed to allow the collect chuck 13 to expand by its own resilience, so that the inside diameter of the collect chuck 13 is increased, allowing the workpiece 51 to be released.

A column 35 is disposed in front of the spindle stock 17 and the guide bush unit 37 is placed on the column 35 with its center axis aligned with that of the spindle.

The guide bush unit 37 is of a stationary type fixedly holding the guide bush 11 to support the workpiece 51 rotatably on the inner surface 11b of the guide bush 11.

A bush sleeve 23 is fitted in the center bore of a holder 39 fixed to the column 35. A taper inner surface 23a is formed in the front end portion of the bush sleeve 23.

The guide bush 11 having a front end portion provided with a taper outer surface 11a and slits 11c is fitted in the center bore of the bush sleeve 23.

A clearance between the inner surface of the guide bush 11 and the outer surface of the workpiece 51 can be adjusted by turning an adjusting nut 43 screwed onto the threaded portion of the guide bush 11 and disposed at the back end of the guide bush unit 37.

More specifically, when the adjusting nut 43 is turned clockwise, the guide bush 11 moves to the right, as viewed in FIG. 13, relative to the bush sleeve 23 and the taper outer surface 11a of the guide bush 11, similarly to the taper outer surface of the collect chuck 13, is pressed against the taper inner surface 23a of the bush sleeve 23 and the inside diameter of the slitted front end portion of the guide bush 11 is reduced.

A cutting tool (cutter) 45 is disposed further in front of the guide bush unit 37.

The workpiece 51 is chucked by the collect chuck 13 mounted on the spindle 19 while being supported by the guide bush unit 37 as well. A portion of the workpiece 51, projecting from the guide bush unit 37 into a machining zone, is machined in a predetermined cutting pattern by a composite motion of the crossfeed move of the cutting tool 45 and the traverse move of the spindle stock 17.

Figure 14:
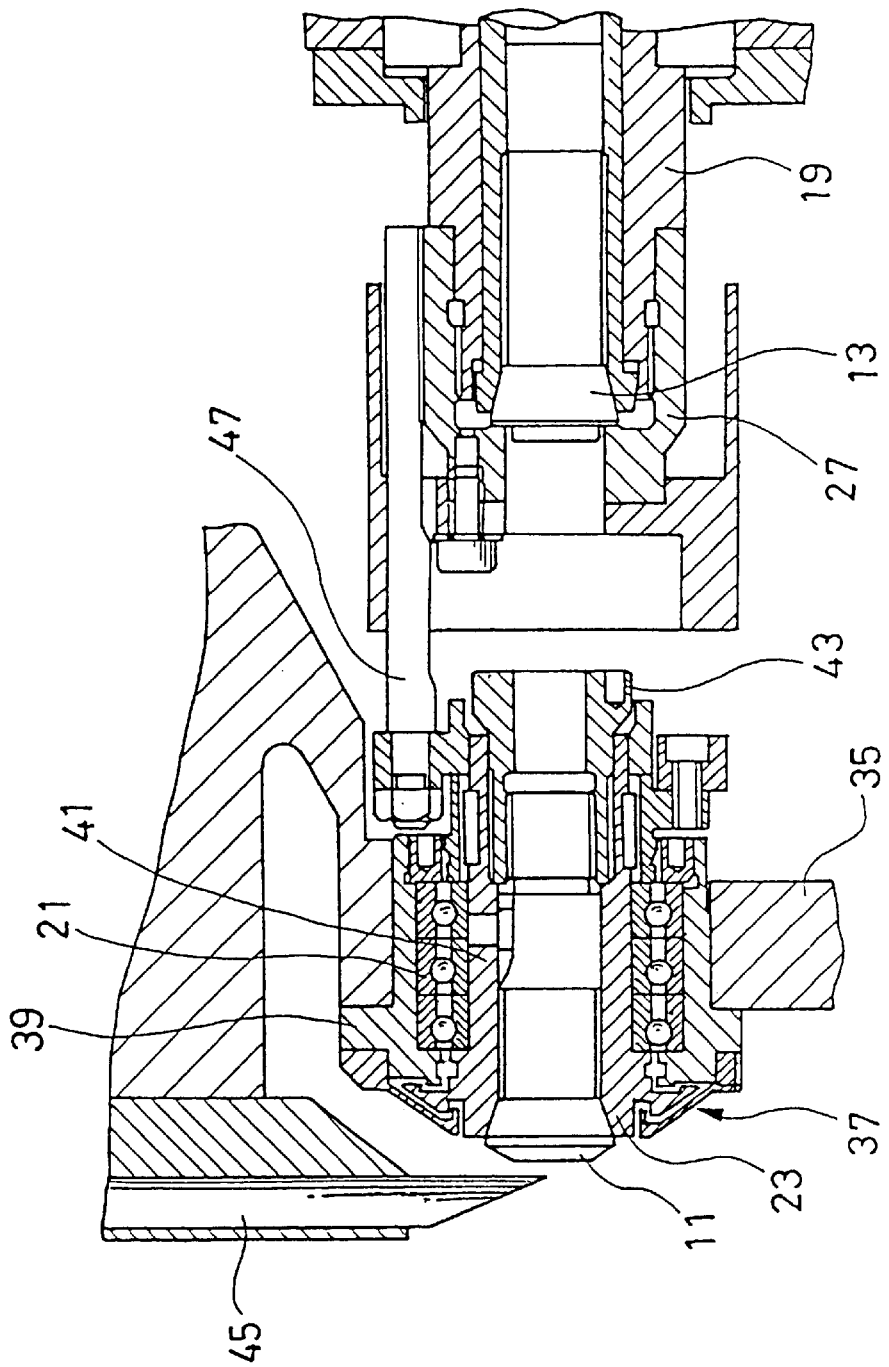
FIG. 14 is a sectional view only of a spindle and associated parts of an automatic lathe provided with a rotary guide bush unit employing the guide bush.

A rotary guide bush unit that utilizes in a rotatable state a guide bush gripping a workpiece will be described with reference to FIG. 14, in which parts like or corresponding to those shown in FIG. 13 are designated by the same reference numerals.

Rotary guide bush units are classified into those holding a guide bush 11 so as to rotate it synchronously with the collect chuck 13 and those holding a guide bush 11 so as to rotate it asynchronously with the collect chuck 13. A guide bush unit 37 shown in the figure holds the guide bush 11 so as to rotate it in synchronism with the collect chuck 13.

The rotary guide bush unit 37 is driven by a drive rod 47 projecting from the cap nut 27 mounted on the spindle 19. A gear mechanism or a belt-and-pulley mechanism may be used instead of the drive rod 47 for driving the guide bush unit 37.

The rotary guide bush unit 37 has a holder 39 fixed to a column 35. A bush sleeve 23 is inserted in the center bore of the holder 39 and is supported rotatably via bearings 21 on the holder 39, and the guide bush 11 is fitted in the center bore of the bush sleeve 23.

The bush sleeve 23 and the guide bush 11 are similar in construction to those illustrated in FIG. 13, respectively. The clearance between the inner surface of the guide bush 11 and the outer surface of the workpiece 51 can be adjusted by turning an adjusting nut 43, screwed onto the threaded portion of the guide bush 11 and disposed at the back end of the guide bush unit 37, thereby reducing the inside diameter of the guide bush 11.

This automatic lathe is of the same construction as that for the automatic lathe illustrated in FIG. 13 except that this automatic lathe is provided with the rotary guide bush unit 37, and hence, further description thereof will be omitted.

Description of Guide Bush Provided with a Hard Carbon Film Formed over the Inner Surface thereof Now, a guide bush provided with a hard carbon film formed over the inner surface thereof by a method according to the present invention will be described hereinafter.

Figure 11:
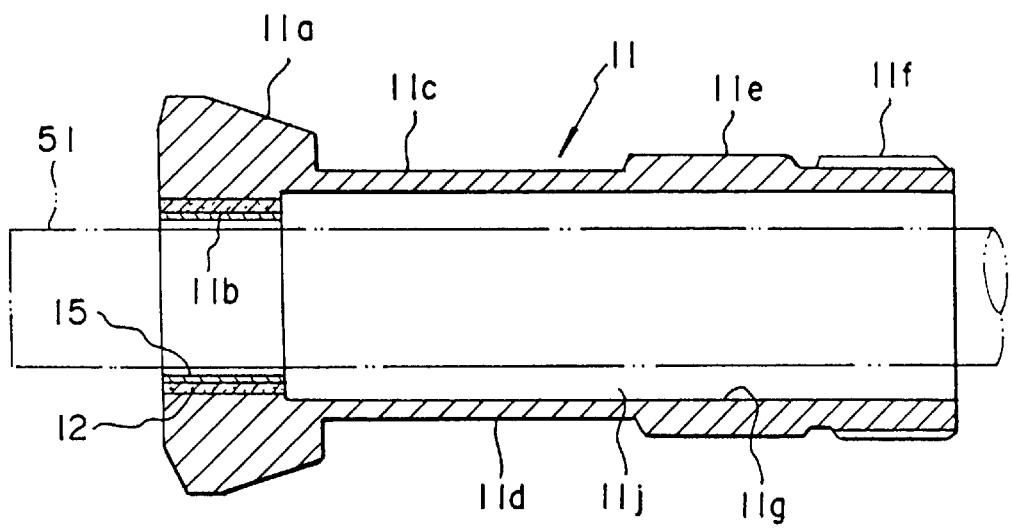
FIGS. 11 and 12 are a longitudinal sectional view and perspective view, respectively, of the guide bush, over the inner surface of which the hard carbon film is formed by the method according to the invention.
Figure 12:
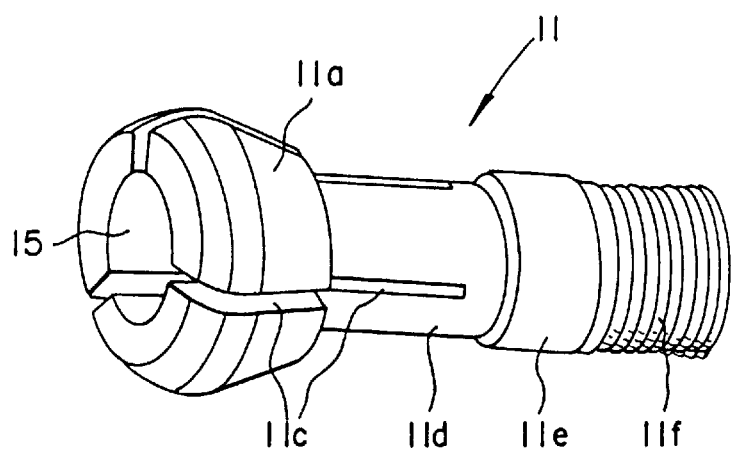

FIG. 11 is a longitudinal sectional view of an example of the guide bush and FIG. 12 a perspective view showing the external appearance thereof.

The guide bush 11 shown in the figures has an open end portion which is shown in a free state. The guide bush has a taper outer surface 11a formed on one end thereof in the longitudinal direction, and a threaded portion 11f on the other end thereof.

Further, the guide bush 11 has a center bore 11j formed along the neutral axis thereof, having varied diameters by a region thereof, and an inner surface 11b for holding a workpiece 51, formed on the inner circumferential surface thereof on the side of the taper outer surface 11a. The guide bush 11 is also provided with a stepped portion 11g having an inside diameter greater than that of the inner surface 11b, formed in the region of the center bore other than the inner surface 11b.

The guide bush 11 is provided with three slits 11c cut at angular intervals of 120° so as to divide the taper outer surface 11a into three equal parts in a region thereof extending from the front end portion having the taper outer surface 11a to an elastic bendable portion 11d.

The clearance between the inner surface 11b and the workpiece 51 indicated by imaginary lines in FIG. 11 can be adjusted by pressing the taper outer surface 11a of the guide bush 11 against the taper inner surface of the bush sleeve, thereby subjecting the elastic bendable portion 11d to a flexing force.

The guide bush 11 has a fitting portion 11e between the elastic bendable portion 11d and a threaded portion 11f. When the fitting portion 11e is fitted into the center bore of the bush sleeve 23 shown in FIGS. 13 and 14, the guide bush 11 can be disposed on the neutral axis of the spindle and parallel therewith.

The guide bush 11 is made of alloy tool steel (SKS). When manufacturing the guide bush 11, the tool steel stock is first formed into a predetermined shape externally and internally, and then is subjected to quenching and annealing.

Further, the inner surface 11b which will come in sliding contact with the workpiece 51 may preferably be formed by fixing a superhard lining 12, 2 to 5 mm in thickness, directly to the guide bush 11 by brazing means as shown in FIG. 11.

For the superhard lining, an alloy steel containing, for example, 85 to 90% of tungsten (W), 5 to 7% of carbon (C), and 3 to 10% of cobalt (Co) as a binder is used.

With the taper outer surface 11a in the closed state, a clearance in the range of 5 to 10 $\mu$m is formed between the inner surface 11b and the workpiece 51 in the radial direction. Accordingly, when the workpiece 51 is caused to make lateral movements, it comes in sliding contact with the inner surface 11b, thereby causing the problem of wear and abrasion.

In the case where the guide bush 11 is used in a stationary guide bush unit, high speed sliding movements occur between the inner surface 11b and the workpiece 51 as the workpiece 51 held by the stationary guide bush 11 is worked on at a high rotational speed, and additionally, an excessively high pressure is applied to the inner surface 11b by the workpiece 51 due to the cutting load, causing a problem of seizure as well.

Therefore, the inner surface 11b of the guide bush 11 is coated with a hard carbon film (DLC film) 15 formed to a thickness in the range of 1 to 5 $\mu$m.

The hard carbon film is very similar in property to diamond as described in the foregoing: the hard carbon has high mechanical strength, a small coefficient of friction, satisfactory self-lubricity, and excellent corrosion resistance.

Accordingly, with the guide bush 11 provided with the hard carbon film 15 formed over the inner surface 11b thereof, the wear resistance is dramatically enhanced, enabling wearing of the inner surface 11b in contact with the workpiece 51 to be restrained even after use for an extended period of time and after a heavy cutting job. It has also become possible to inhibit occurrence of damage to the workpiece 51, and seizure between the guide bush 11 and the workpiece 51.

The hard carbon film can be formed directly over the inner surface of a substrate metal (SKS) forming the guide bush 11 or over the inner surface of the superhard lining 12, however, the hard carbon film may preferably be formed via a thin intermediate layer (not shown) to enhance adhesion of the hard carbon film with the inner surface 11b.

The intermediate layer may be composed of an element belonging to sub-group IVb in the periodic table of elements, such as silicon (Si), germanium (Ge), or a compound containing silicon or germanium. Or a compound containing carbon, such as a silicon carbide (SiC) or titanium carbide (TiC), may also be used.

For the intermediate layer, a compound of silicon (Si) and an element selected from the group consisting of titanium (Ti), tungsten (W), molybdenum (Mo), and tantalum (Ta) may also be used.

The intermediate layer may be a two-layer film consisting of a lower layer composed of titanium (Ti) or chromium (Cr), and an upper layer composed of silicon (Si) or germanium (Ge).

With the intermediate layer formed as described above, titanium or chromium in the lower layer thereof serves for maintaining adhesion with the substrate metal of the guide bush 11 or the superhard lining 12, and silicon or germanium in the upper layer thereof serves for reinforcing bonding with the hard carbon film 15 through covalent bonds therewith.

The thickness of the intermediate layer described above is set to be on the order of 0.5 $\mu$m. However, in the case that the intermediate layer is formed of the two-layer film, the thicknesses of the upper and lower layers are each set to be on the order of 0.5 $\mu$m.

Method of Forming the Hard Carbon Film

Various embodiments of a method of forming the hard carbon film over the inner surface of the guide bush, according to the present invention, will be described hereinafter.

First Embodiment

Now, a first embodiment of the method of forming the hard carbon film over the inner surface of the guide bush, according to the present invention, is described with reference to FIGS. 1 and 8.

Figure 1:
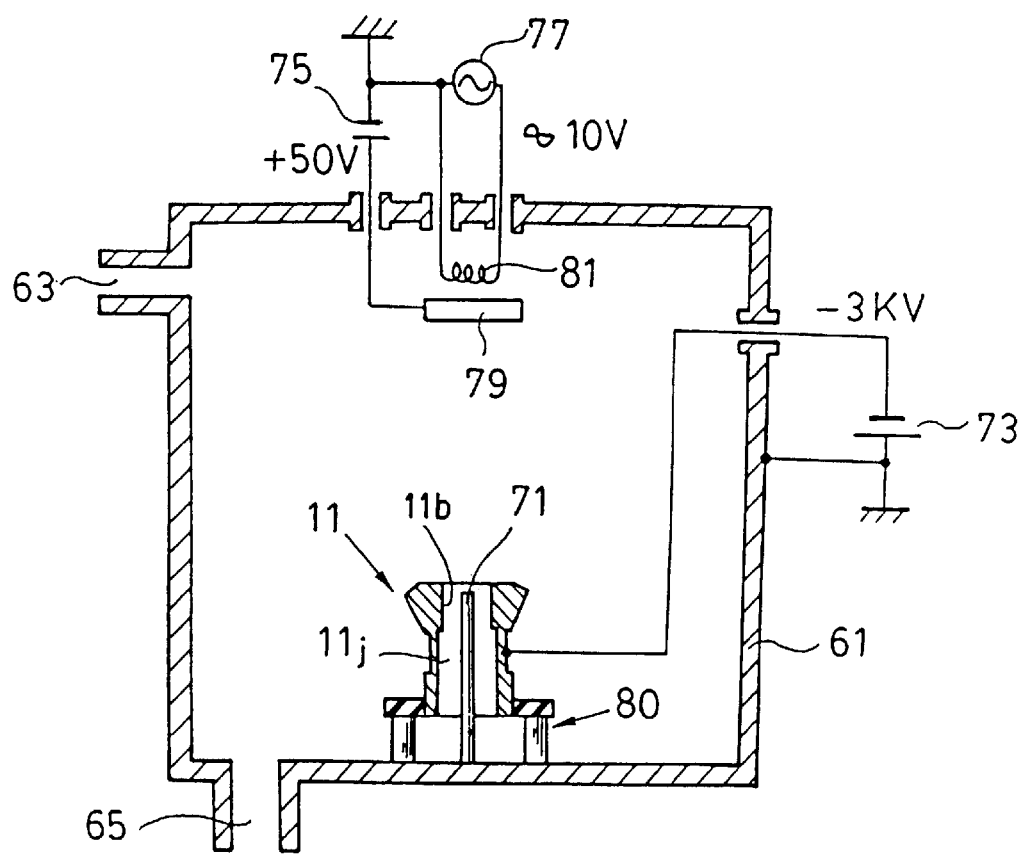
FIGS. 1 to 4, and FIGS. 6 and 7 are schematic sectional views of an apparatus used in carrying out first to sixth embodiments, respectively, of a method of forming a hard carbon film over the inner surface of a guide bush, according to the present invention.

FIG. 1 is a schematic sectional view of an apparatus used in carrying out the first embodiment of the method according to the present invention. FIG. 8 is a graph showing a relationship between pressure inside a vacuum vessel after a carbon-containing gas is fed therein and time, with reference to the first embodiment of the invention.

In FIG. 1, a vacuum vessel 61 is provided with a gas inlet port 63 and an evacuation port 65. An anode 79 and a filament 81 are disposed in the upper central region inside the vacuum vessel 61. The guide bush 11 is mounted in an upright position with its lower portion fixed on an insulating support 80 disposed in the lower central region inside the vacuum vessel 61.

An auxiliary electrode 71 in the shape of a thin rod is disposed so as to be inserted in the center bore 11j of the guide bush 11 and grounded via the vacuum vessel 61.

Further, the auxiliary electrode 71 is positioned in the central region of the center bore 11j so as to be substantially on the neutral axis thereof.

The auxiliary electrode 71 is made of a metal stock such as stainless steel, or the like. It is desirable to dispose the auxiliary electrode 71 such that the extremity thereof is positioned about 1 mm inside of the open end face (the upper end face in FIG. 1) of the guide bush 11 so as not to be protruded therefrom.

Then, the vacuum vessel 61 is evacuated until the degree of vacuum reaches an initially reached pressure not higher than $3 \times 10^{-5}$ torr by discharging air out of the evacuation port 65.

Subsequently, a negative DC voltage is applied to the guide bush 11 from a DC power source 73, a positive DC voltage is applied to the anode 79 from an anode power source 75, and further, an AC voltage is applied to the filament 81 from a filament power source 77.

In this instance, a negative DC voltage of about −3 kV is applied to the guide bush 11 from the DC power source 73 and a positive DC voltage of about 50 V is applied to the anode 79 from the anode power source 75. And an AC voltage on the order of 10 V is applied to the filament 81 from the filament power source 77 so that 30 A current flows to the filament 81.

Thereafter, benzene ($C_6H_6$) gas as a carbon-containing gas is fed into the vacuum vessel 61 through the gas inlet port 63, regulating the pressure in the vacuum vessel 61 to be at a film-forming pressure of $5 \times 10^{-3}$ torr.

Figure 8:
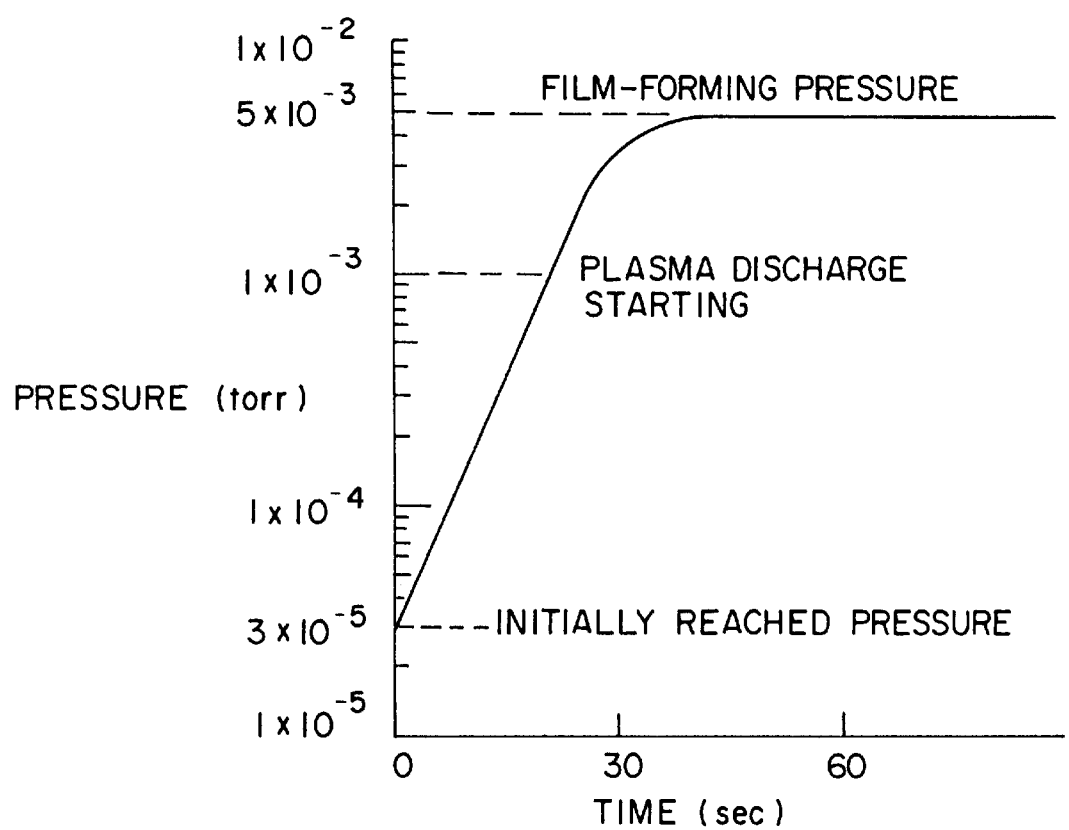
FIG. 8 is a graph showing a relationship between a pressure inside a vacuum vessel and time with reference to the first embodiment, and the like, of the invention.

With the elapse of time, the pressure in the vacuum vessel 61 undergoes changes as shown in FIG. 8, causing plasma discharge to start in a region surrounding the guide bush 11 inside the vacuum vessel 61 at a pressure of $1 \times 10^{-3}$ torr, lower than the film-forming pressure of $5 \times 10^{-3}$ torr. Thereafter, by the agency of a plasma produced in a region between the inner surface 11b of the guide bush 11 and the auxiliary electrode 71, formation of the hard carbon film starts over the inner surface 11b of the guide bush 11.

While the hard carbon film is being formed over the inner surface 11b of the guide bush 11 by means of a plasma CVD process, the pressure in the vacuum vessel 61 will reach the film-forming pressure, and thereafter, will be maintained at the film-forming pressure.

Thus, by applying a negative DC voltage to the guide bush 11 before feeding the carbon-containing gas into the vacuum vessel 61, a plasma discharge is caused to start at a pressure lower than the film-forming pressure.

That is, since the plasma discharge is caused to start while impedance of the interior space is higher than that at the time when the film-forming pressure is attained, an unintended discharge, that is, an arc discharge, does not occur. Without occurrence of the unintended arc discharge in an initial stage of the hard carbon film formation, degradation of the adhesion property of the hard carbon film is prevented. Hence, by the method according to the invention, the problem of the hard carbon film formed over the inner surface 11b of the guide bush 11 being exfoliated from the guide bush does not occur.

Further, in the first embodiment of the invention, the hard carbon film 15 is formed with the auxiliary electrode 71 grounded and disposed in the central region of the center bore 11j of the guide bush 11, and a negative DC voltage is applied to the guide bush 11.

This will create a situation where the auxiliary electrode 71 at a ground potential is placed inside the center bore 11j of the guide bush 11, wherein electrodes at the same potential face each other, therefore, the electrodes at the same potential will not face each other. As this is an ideal potential condition in the case of the plasma CVD process, an unintended discharge such as a hollow discharge does not occur. Consequently, the hard carbon film having excellent adhesion property can be formed over the inner surface 11b of the guide bush 11.

Further, since the potential distribution on the inner surface of the guide bush 11 becomes uniform in the longitudinal direction thereof, the distribution of thickness of the hard carbon film formed over the inner surface 11b becomes uniform as well. In addition, as the hard carbon film is formed at a high deposition rate, the hard carbon film which is uniformed in thickness from the open end face toward the innermost end of the guide bush can be formed by the process and completed in a short time.

The auxiliary electrode 71 may be of any diameter provided that the diameter thereof is less than the diameter of the bore of the guide bush 11. However, the diameter of the auxiliary electrode 71 should preferably be set such that a clearance of about 5 mm, i.e., a clearance for a plasma forming region, is formed between the auxiliary electrode 71 and the inner surface 11b on which the hard carbon film is formed. The ratio of the diameter of the auxiliary electrode 71 to that of the bore of the guide bush 11 should preferably be set at not more than $\frac{1}{10}$. When the auxiliary electrode 71 is to be made thinner, the same may be formed in the shape of a wire.

The auxiliary electrode 71 is formed of stainless steel as described previously in this embodiment. However, the same may be formed of a metal having a high melting point such as tungsten (W) or tantalum (Ta).

Second Embodiment

A second embodiment of a method of forming the hard carbon film over the inner surface of a guide bush, according to the present invention will be described hereinafter with reference to FIGS. 2 and 9.

Figure 2:
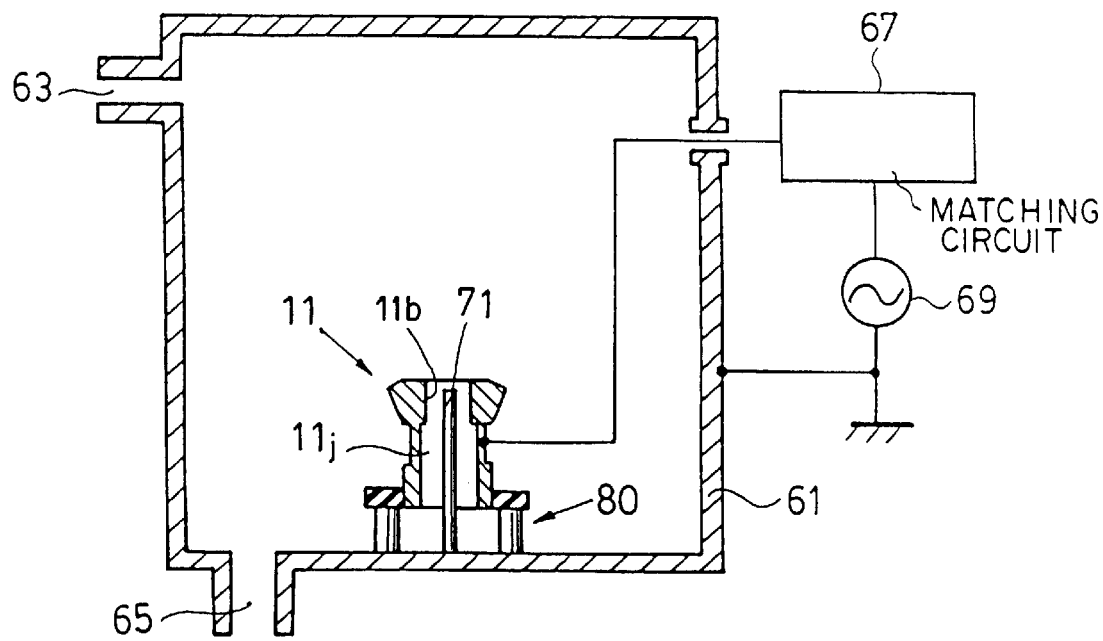

FIG. 2 is a schematic sectional view of an apparatus used in carrying out the second embodiment of the method according to the present invention, in which parts like or corresponding to those shown in FIG. 1 are designated by the same reference numerals and description thereof is omitted. FIG. 9 is a graph showing a relationship between pressure inside the vacuum vessel after a carbon-containing gas is fed therein and time, with reference to the second embodiment of the invention.

The vacuum vessel 61 used in carrying out the second embodiment of the invention is not provided with an anode and a filament therein.

As shown in FIG. 2, in the second embodiment of the invention as well, a guide bush 11 and an auxiliary electrode 71 are disposed inside the vacuum vessel 61 similar to the case of the first embodiment described above.

Then, the vacuum vessel 61 is evacuated until a degree of vacuum reaches an initially reached pressure at not higher than $3 \times 10^{-5}$ torr, discharging air out of an evacuation port 65 by an evacuating means (not shown).

Thereafter, RF power of 400 W supplied from an RF power source 69 at an oscillation frequency of 13.56 MHz is applied to the guide bush 11 via a matching circuit 67.

Subsequently, methane gas ($CH_4$) as a carbon-containing gas is fed into the vacuum vessel 61 through a gas inlet port 63, regulating the degree of vacuum in the vacuum vessel 61 to be at a film-forming pressure of 0.5 torr.

Figure 9:
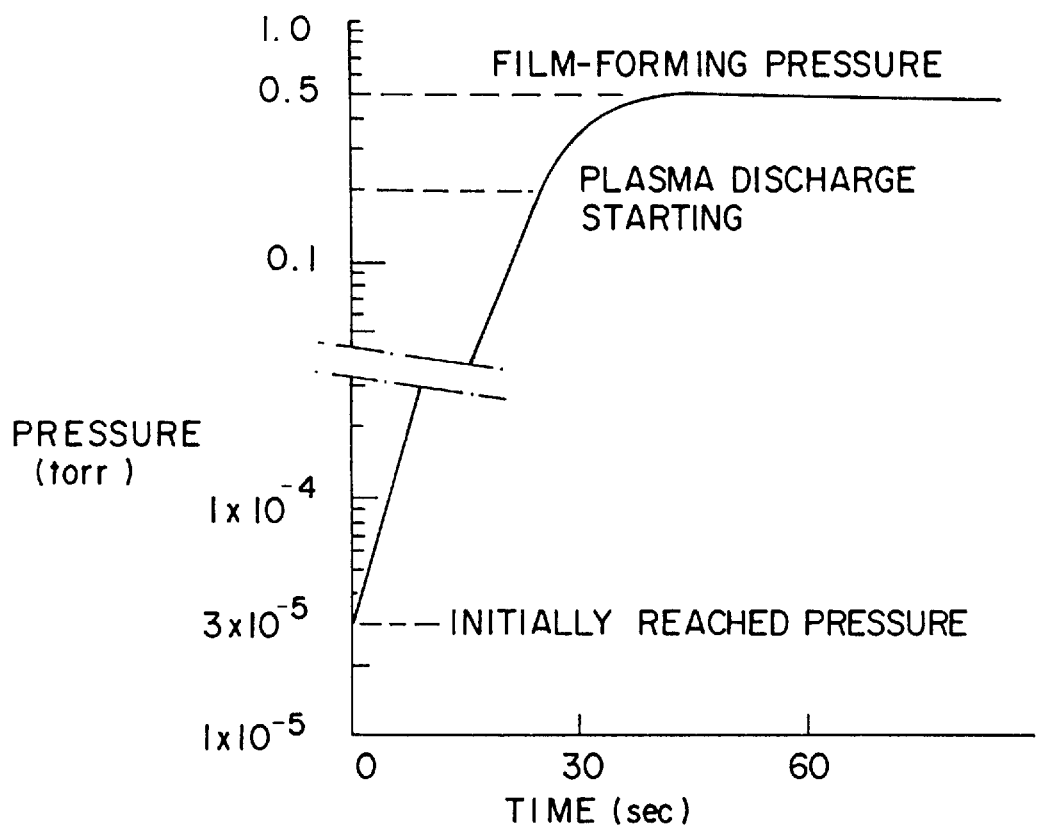
FIG. 9 is a graph showing a relationship between a pressure inside a vacuum vessel and time with reference to the second embodiment, and the like, of the invention.

With the elapse of time, the pressure in the vacuum vessel 61 changes as shown in FIG. 9, causing a plasma discharge to start in a region surrounding the guide bush 11 inside the vacuum vessel 61 at a pressure of 0.2 torr, lower than the film-forming pressure of 0.5 torr. Thereafter, by the agency of a plasma produced in a region between the inner surface 11b of the guide bush 11 and the auxiliary electrode 71, formation of the hard carbon film starts over the inner surface 11b of the guide bush 11.

While the hard carbon film is being formed over the inner surface 11b of the guide bush 11 by means of a plasma CVD process, the pressure in the vacuum vessel 61 will reach the film-forming pressure at 0.5 torr, and thereafter, will be maintained at the film-forming pressure.

Thus, in the second embodiment, RF power is applied to the guide bush 11 before the carbon-containing gas is fed into the vacuum vessel 61.

In the second embodiment, operations and effects similar to those for the first embodiment can be obtained so that a hard carbon film uniform in thickness and having an excellent adhesion property can be formed over the inner surface 11b of the guide bush 11 at a high deposition rate.

Third Embodiment

A third embodiment of a method of forming the hard carbon film over the inner surface of a guide bush, according to the present invention, will be described hereafter with reference to FIGS. 3 and 9.

Figure 3:
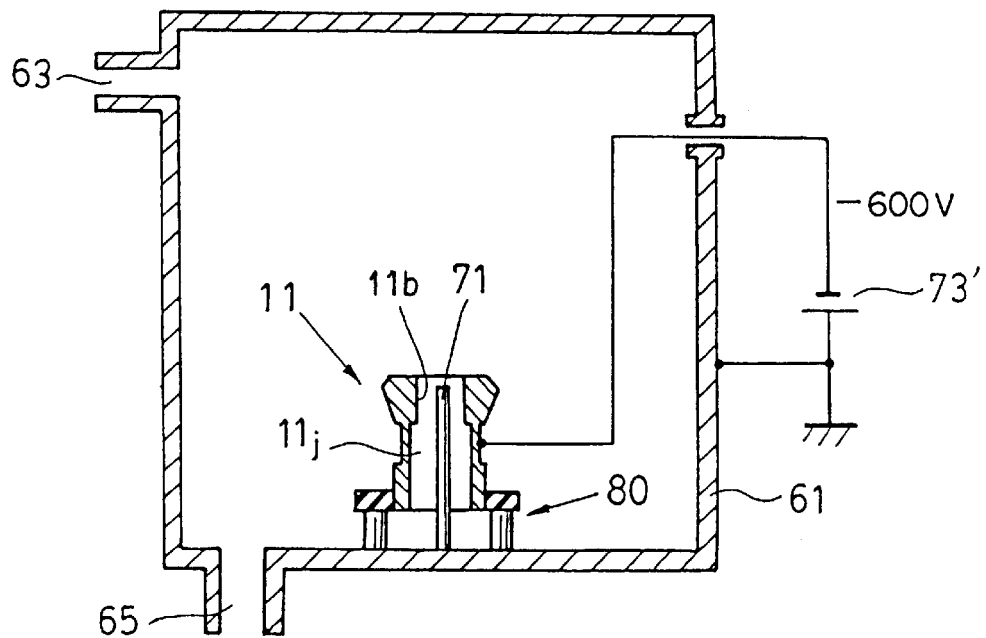

FIG. 3 is a schematic sectional view of an apparatus used in carrying out the third embodiment of the method according to the present invention, in which parts like or corresponding to those shown in FIG. 1 are designated by the same reference numerals and description thereof is omitted.

A vacuum vessel 61 used in carrying out the third embodiment of the invention is not provided with an anode and a filament therein either.

As shown in FIG. 3, in the third embodiment of the invention as well, a guide bush 11 and an auxiliary electrode 71 are disposed inside the vacuum vessel 61 similarly to the case of the first embodiment described above.

Then, the vacuum vessel 61 is evacuated until the degree of vacuum reaches an initially reached pressure at not higher than $3 \times 10^{-5}$ torr, discharging air out of an evacuation port 65 by evacuating means (not shown).

Thereafter, a DC voltage at −600 V is applied to the guide bush 11 from a DC power source 73'.

Subsequently, methane gas ($CH_4$) as a carbon-containing gas is fed into the vacuum vessel 61 through the gas inlet port 63, regulating the degree of vacuum in the vacuum vessel 61 to be at a film-forming pressure of 0.5 torr.

With the elapse of time, the pressure in the vacuum vessel 61 changes as shown in FIG. 9, causing plasma discharge to start in a region surrounding the guide bush 11 inside the vacuum vessel 61 at a pressure of 0.2 torr, lower than the film-forming pressure of 0.5 torr.

Then, by the agency of a plasma produced in a region between the inner surface 11b of the guide bush 11 and the auxiliary electrode 71, formation of the hard carbon film 15 starts over the inner surface 11b of the guide bush 11.

While the hard carbon film is being formed over the inner surface 11b of the guide bush 11 by means of a plasma CVD process, the pressure in the vacuum vessel 61 will reach the film-forming pressure at 0.5 torr, and thereafter, will be maintained at the film-forming pressure.

Thus, in the third embodiment, a negative DC voltage is applied to the guide bush 11 before the carbon-containing gas is fed into the vacuum vessel 61.

In the third embodiment, operations and effects similar to those for the first embodiment can be obtained so that a hard carbon film uniform in thickness and having an excellent adhesion property can be formed over the inner surface 11b of the guide bush 11 at a high deposition rate.

As described hereinbefore, with the third embodiment of the invention, a negative DC voltage is applied to the guide bush 11 before feeding the carbon-containing gas (methane gas) into the vacuum vessel 61. Still, the operations and effects similar to those for the first embodiment are obtained, enabling rapid formation of a hard carbon film of high quality having an excellent adhesion property and uniform in thickness over the inner surface 11b of the guide bush 11.

Fourth Embodiment

A fourth embodiment of a method of forming a hard carbon film over the inner surface of a guide bush according to the present invention will be described hereinafter with reference to FIGS. 4, 5 and 10.

Figure 4:
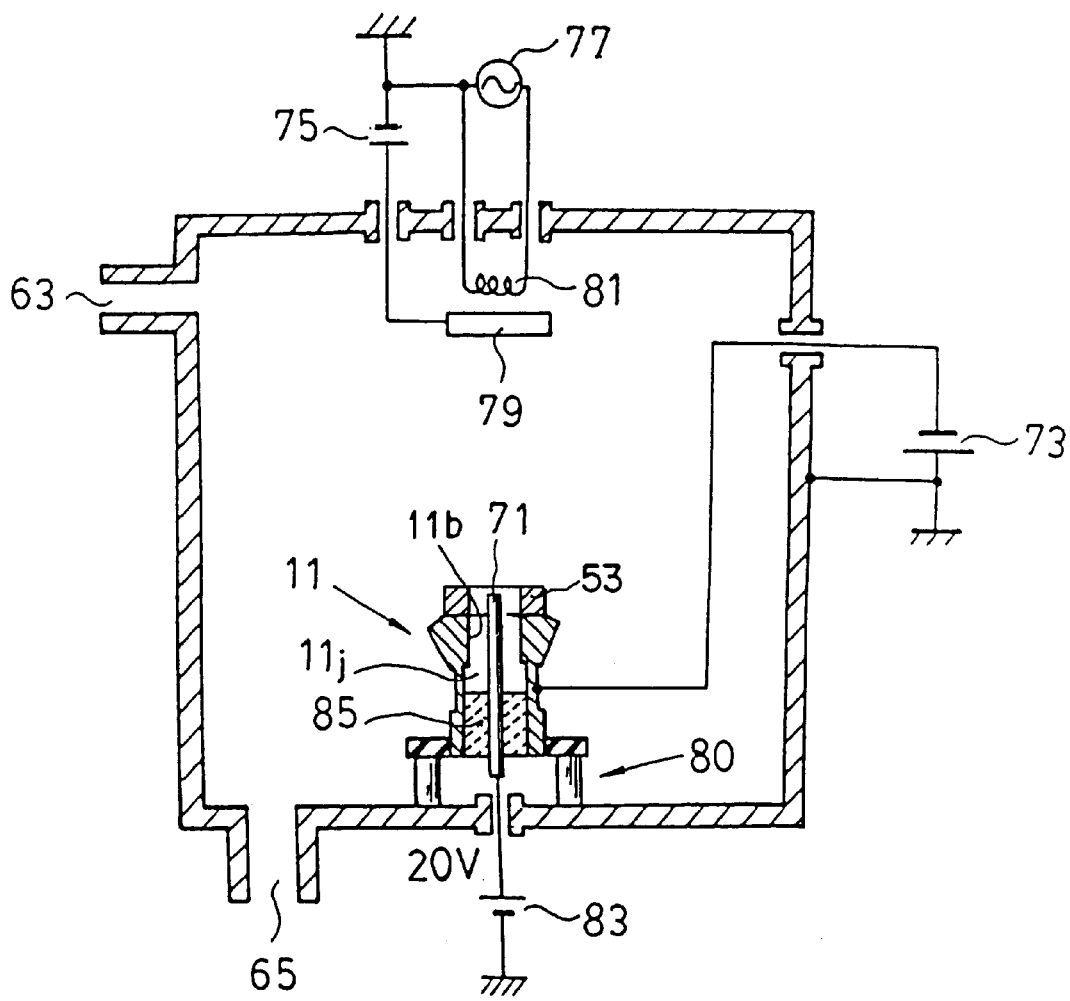

FIG. 4 is a schematic sectional view of an apparatus used in carrying out the fourth embodiment of the present invention, which differs from the same shown in FIG. 1 in that an auxiliary electrode 71 is supported by a porcelain insulator 85 fitted into the center bore 11j of the guide bush 11 so as to be insulated from both the guide bush 11 and a vacuum vessel 61 and a positive DC voltage (for example, 20 V) is applied to the auxiliary electrode 71 from an auxiliary power source 83.

Figure 5:
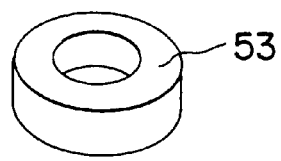
FIG. 5 is a perspective view of a dummy member used in the embodiments shown in FIGS. 4, 6, and 7, respectively.

Further, in the fourth embodiment, a ring-like dummy member 53 as shown in FIG. 5, having an inside diameter substantially equal to the diameter of the inner surface 11b of the guide bush 11 is employed. The dummy member 53, too, is formed of stainless steel similar to the case of the auxiliary electrode 71, and has an outside diameter substantially equal to the outside diameter of the open end face of the guide bush 11.

As shown in FIG. 4, the guide bush 11 in which the hard carbon film is formed is disposed in the vacuum vessel 61 provided with a gas inlet port 63 and an evacuation port 65, and the auxiliary electrode 71 is supported by the porcelain insulator 85 in the center bore 11j of the guide bush 11, insulated from the guide bush. Further, the dummy member 53 is disposed on the open end face of the guide bush 11 on the side of a taper outer surface (the upper end face in FIG. 4) thereof.

At this time, the inner surface of the dummy member 53 aligns with that of the guide bush 11.

Subsequent steps of the method according to this embodiment are the same as those for the first embodiment described with reference to FIG. 1, and description thereof is therefore omitted.

Figure 10:
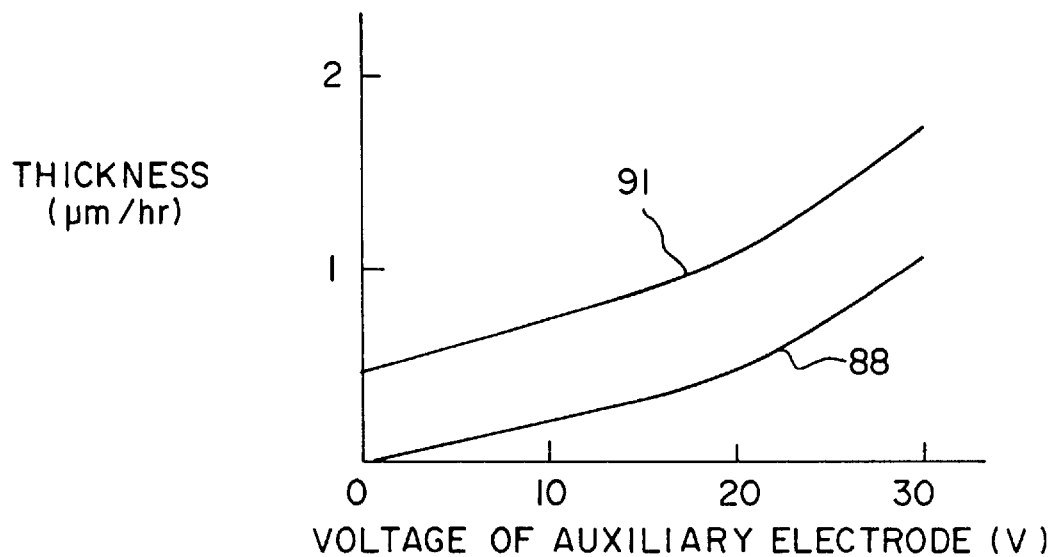
FIG. 10 is a graph showing a relationship between voltages applied to an auxiliary electrode according to the fourth to sixth embodiments of the invention, respectively, and thickness of a hard carbon film formed per hour.

FIG. 10 is a graph showing a relationship between positive DC voltages applied to the auxiliary electrode 71 in this embodiment and thickness of the hard carbon film formed over the inner surface 11b of the guide bush 11 per unit hour.

In FIG. 10, the thickness of the hard carbon film formed is shown when a positive DC voltage applied to the auxliary electrode 71 is varied from 0 V to 30 V, and the clearance between the inner surface 11b of the guide bush 11 and the auxiliary electrode 71 is 3 mm and 5 mm, respectively. Curves 88 and 91 indicate characteristics of the relationship in the case of the clearance being 3 mm and 5 mm, respectively.

As shown by the curves 88 and 91, the deposition rate of the hard carbon film increases as the positive DC voltage applied to the auxiliary electrode 71 increases. Also, the greater the clearance between the inner surface of the guide bush 11 and the auxiliary electrode 71, the higher that the deposition rate of the hard carbon film becomes.

When the clearance between the inner surface of the guide bush 11 and the auxiliary electrode 71 is 3 mm (curve 88). no plasma is produced in the center bore 11j of the guide bush 11 if the voltage applied to the auxiliary electrode 71 is 0 V at a ground potential, and consequently, the hard carbon film can not be formed.

However, even in this instance, when the positive DC voltage applied to the auxiliary electrode 71 is increased, a plasma is produced around the auxiliary electrode 71 in the center bore 11j of the guide bush 11 and the hard carbon film can be formed.

It is therefore possible to form a hard carbon film over the inner surface of a guide bush having a center bore 11j of even a small diameter by carrying out the method of forming the film when a positive DC voltage is applied to the auxiliary electrode 71.

The dummy member 53 used in carrying out the fourth embodiment of the invention performs an operation as follows.

That is, with the method of forming the hard carbon film over the inner surface of the gude bush 11, a plasma is produced on both the inner and the outer surfaces of the guide bush 11. Electric charges tend to be concentrated in a region around the open end face of the guide bush 11, causing a condition wherein the region around the open end face is at a higher potential level than the inner surface of the guide bush, and the so-called edge effect occurs. Accordingly, the intensity of the plasma in the vicinity of the open end face of the guide bush 11 is greater and more unstable than that of the plasma at other regions of the guide bush 11.

Furthermore, a portion of the guide bush 11, in the region around the open end face, is subjected to the influence of the plasma produced over the outer surface of the guide bush 11 as well as inside the guide bush 11.

If the hard carbon film is formed under such a condition, the adhesion property and quality of that portion of the hard carbon film formed in a region several millimeters inside from the open end face of the guide bush 11 will differ somewhat from that of those portions of the hard carbon film formed at other regions of the guide bush 11.

However, when the dummy member 53 is disposed on the open end face of the guide bush 11 as shown in FIG. 4 prior to the formation of the hard carbon film, a portion of the hard carbon film having an adhesion property and quality different from those of other portions of the film is not formed on the inner surface of the guide bush 11, but on the inner surface of the dummy member 53 instead.

Other operations and effects of this embodiment are the same as those for the first embodiment.

Fifth and Sixth Embodiments

Now, a fifth and a sixth embodiment of a method of forming the hard carbon film over the inner surface of a guide bush according to the present invention will be described with reference to FIGS. 6 and 7, respectively.

Figure 6:
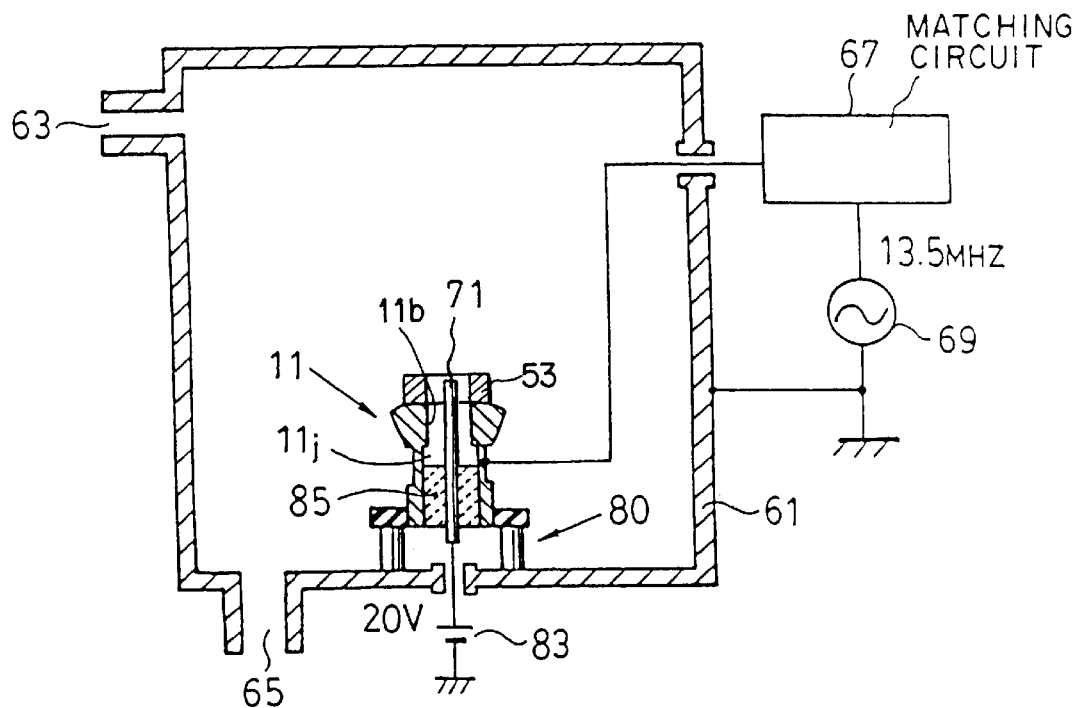
Figure 7:
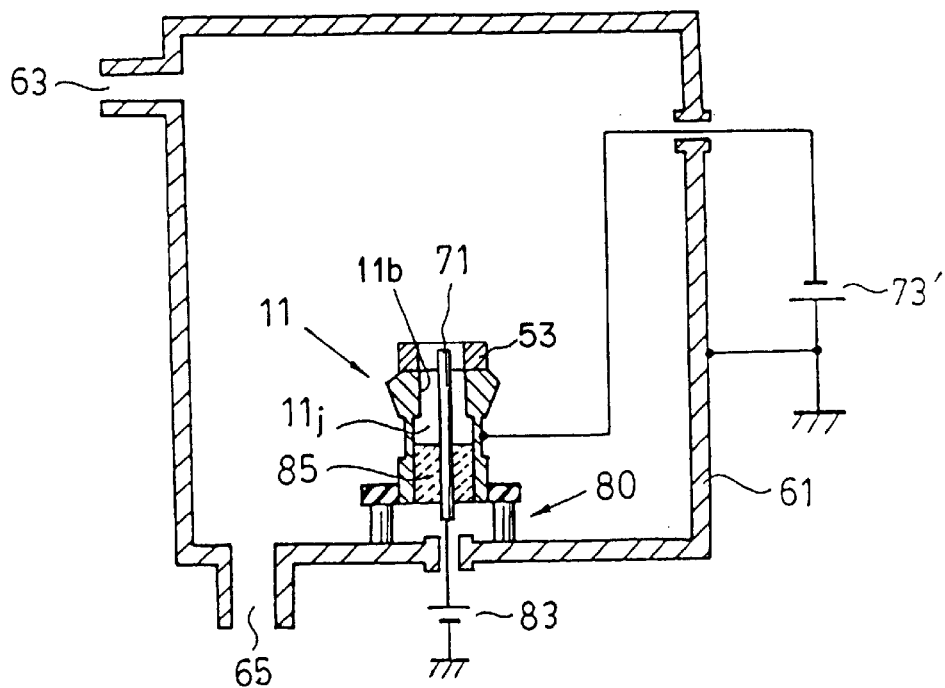

FIGS. 6 and 7, similar to FIGS. 2 and 3, respectively, are schematic sectional views of an apparatus used in carrying out the fifth and sixth embodiments of the present invention. The fifth and sixth embodiments differ from the previously described embodiments shown in FIGS. 2 and 3, respectively, only in that an auxiliary electrode 71 is supported by an insulator 85 fitted into the center bore 11j of a guide bush 11 so as to be insulated from both the guide bush 11 and the vacuum vessel 61, a positive DC voltage (for example, 20 V) is applied to the auxiliary electrode 71 from an auxiliary power source 83, and a dummy member 53 is employed, similarly to the case of the fourth embodiment shown in FIG. 4.

In the fifth embodiment shown in FIG. 6, RF power of 400 W supplied from an RF power source 69 at an oscillation frequency of 13.56 MHz is applied to the guide bush 11 via a matching circuit 67, producing a plasma in a vacuum vessel 61.

In the sixth embodiment shown in FIG. 7, a DC voltage at −600 V is applied to the guide bush 11 from a DC power source 73', producing a plasma.

Each of the other steps of the method according to this embodiment is the same as those for the second and third embodiments previously described, respectively, and the effect of operation of the sixth embodiment is the sum of that of the second and third embodiments, respectively, and the effect of the fourth embodiment wherein a positive DC voltage is applied to the auxiliary electrode and the dummy member is employed.

The dummy member 53 may be applied to from the first to the third embodiments as well, wherein the auxiliary electrode 71 is kept at the ground potential, and in such a case, the effect of operation of the dummy member 53 is the same as that for from the fourth to the sixth embodiments, respectively.

Other Embodiments

Other embodiments of the invention, using a mixed gas of argon and either methane or benzene as a carbon-containing gas, will be described hereinafter only with respect to differences from the respective embodiments described hereinbefore.

Firstly, an embodiment employing the apparatus shown in FIG. 1 as in the case of the first embodiment will be described.

After disposing a guide bush 11 and an auxiliary electrode 71 in the vacuum vessel 61 shown in FIG. 1, the vacuum vessel 61 is evacuated until the degree of vacuum reaches an initially reached pressure at not higher than $3 \times 10^{-5}$ torr.

Subsequently, a DC voltage at −1.5 kV is applied to the guide bush 11 from a DC power source 73, a DC voltage at +50 V is applied to an anode 79 from an anode power source 75, and further, an AC voltage at 10 V is applied to a filament 81 from a filament power source 77 so as to cause the flow of a 30 A current.

Thereafter, a mixed gas of benzene ($C_6H_6$) and argon as a carbon-containing gas is fed into the vacuum vessel 61 through the gas inlet port 63, regulating the pressure in the vacuum vessel 61 to be at a film-forming pressure of $8 \times 10^{-4}$ torr. The ratio of the flow rate of benzene to that of argon is set at 50:50.

Then, at a pressure of $1 \times 10^{-3}$ torr, lower than the film-forming pressure of $5 \times 10^{-3}$ torr, a plasma discharge is caused to start in a region surrounding the guide bush 11 inside the vacuum vessel 61.

Thereafter, by the agency of a plasma produced in a region between the inner surface 11b of the guide bush 11 and the auxiliary electrode 71, the formation of the hard carbon film starts over the inner surface 11b of the guide bush 11.

Thus, in this embodiment, the mixed gas of a carbon-containing gas and argon gas is introduced as a gas fed into the vacuum vessel 61. Argon gas has characteristics of causing plasma discharge to start at a voltage (ionization potential) lower than that for benzene, that is, the carbon-containing gas, as well as of causing plasma discharge at a lower pressure than that for benzene.

It is therefore possible to lower the negative DC voltage applied to the guide bush 11 lower than that for conventional cases and also to lower the plasma discharge starting pressure lower than that for conventional cases. Consequently, it has become possible to further inhibit the occurrence of arc discharge at the moment plasma discharge starts, enabling the adhesion of the hard carbon film to be further enhanced.

Furthermore, this embodiment can provide the additional effect of improving further the quality of the hard carbon film due to a bombard effect thereof whereby weakly bonded constituents are driven out through collision of argon ions not contributing to the formation of the hard carbon film with the surface of the hard carbon film in the course of the film formation.

Another embodiment employing the apparatus shown in FIG. 2 as in the case of the second embodiment will be described next.

After disposing a guide bush 11 and an auxiliary electrode 71 in the vacuum vessel 61 shown in FIG. 2, similar to the case of the first embodiment, the vacuum vessel 61 is evacuated until the degree of vacuum reaches an initially reached pressure at not higher than $3\times10^{-5}$ torr.

Thereafter, RF power of 250 W is applied to the guide bush 11 via a matching circuit 67 from an RF power source 69 an oscillation frequency of 13.56 MHz.

Then, a mixed gas of methane ($CH_4$) and argon as a carbon-containing gas is fed into the vacuum vessel 61 through the gas inlet port 63, regulating the pressure in the vacuum vessel 61 to be at a film-forming pressure of 0.5 torr. In this case too, the ratio of the flow rate of methane to that of argon is set at 50:50.

With the lapse of time, at a pressure of 0.1 torr, lower than the film-forming pressure of 0.5 torr, plasma discharge is caused to start in a region surrounding the guide bush 11 inside the vacuum vessel 61. Thereafter, by the agency of a plasma produced in a region between the inner surface 11$b$ of the guide bush 11 and the auxiliary electrode 71, the formation of the hard carbon film 15 starts over the inner surface 11$b$ of the guide bush 11.

With this embodiment as well, it has become possible to inhibit further the occurrence of arc discharge at the moment plasma discharge starts, as in the case of the preceding embodiment, enabling the adhesion of the hard carbon film to be further enhanced.

Yet another embodiment employing the apparatus shown in FIG. 3 as in the case of the third embodiment will be described hereinafter.

After disposing a guide bush 11 and an auxiliary electrode 71 in the vacuum vessel 61 shown in FIG. 3, similar to the case of the third embodiment, the vacuum vessel 61 is evacuated until the degree of vacuum reaches an initially reached pressure at not higher than $3\times10^{-5}$ torr.

Thereafter, a DC voltage at −450 V is applied to the guide bush 11 from a DC power source 73'.

Subsequently, a mixed gas of methane ($CH_4$) and argon as a carbo-ncontaining gas is fed into the vacuum vessel 61 through the gas inlet port 63, regulating the degree of vacuum in the vacuum vessel 61 to be at a film-forming pressure of 0.5 torr. In this case as well, the ratio of the flow rate of methane to that of argon is set at 50:50.

With the lapse of time, at a pressure of 0.1 torr, lower than the film-forming pressure of 0.5 torr, plasma discharge is caused to start in a region surrounding the guide bush 11 inside the vacuum vessel 61. Thereafter, by the agency of a plasma produced in a region between the inner surface 11$b$ of the guide bush 11 and the auxiliary electrode 71, the formation of the hard carbon film 15 starts over the inner surface 11$b$ of the guide bush 11.

Thus, with this embodiment as well, it has become possible to inhibit further the occurrence of arc discharge at the moment plasma discharge starts as in the case of the preceding embodiment, enabling the adhesion of the hard carbon film to be further enhanced.

The method of forming the hard carbon film using a mixed gas of argon and either benzene or methane as a carbon-containing gas as described in the foregoing may be carried out in the apparatus shown in FIGS. 4, 6 and 7, respectively, in the same manner as in the case of the fourth, fifth, and sixth embodiment.

Now, with reference to other embodiments of the invention wherein a plasma is caused to be generated by feeding a mixed gas of argon and either methane or benzene as the carbon-containing gas into the vacuum vessel in an initial stage, after which the plasma is stabilized, and only methane or benzene is fed into the vacuum vessel, speeding up the formation of the hard carbon film, and only points differing from the respective embodiments described hereinbefore will be described hereinafter.

Firstly, an embodiment employing the apparatus shown in FIG. 4 as in the case of the fourth embodiment will be described.

In the same manner as in the case of the fourth embodiment, a guide bush 11, an auxiliary electrode 71, and a dummy member 53 are disposed inside the vacuum vessel 61 as shown in FIG. 4, and the vacuum vessel 61 is then evacuated until the degree of vacuum reaches the initially reached pressure at not higher than $3\times10^{-5}$ torr.

Subsequently, a DC voltage at −1.5 kV is applied to the guide bush 11 from a DC power source 73, a DC voltage at +50 V is applied to an anode 79 from an anode power source 75, and further, an AC voltage at 10 V is applied to a filament 81 from a filament power source 77 so as to cause the flow of a 30 A current. Also, a DC voltage at +20 V is applied to the auxiliary electrode 71 from an auxiliary electrode power source 83.

Thereafter, a mixed gas of benzene ($C_6H_6$) and argon as a carbon-containing gas is fed into the vacuum vessel 61 through the gas inlet port 63, regulating the pressure in the vacuum vessel 61 to be at a film-forming pressure of $5\times10^{-3}$ torr. The ratio of the flow rate of benzene to that of argon is set at 50:50.

Then, at a pressure of $8\times10^{-4}$ torr, lower than the film-forming pressure of $5\times10^{-3}$ torr, plasma discharge is caused to start in a region surrounding the guide bush 11 inside the vacuum vessel 61. With the elapse of 2 minutes after the stabilization of the plasma, only benzene as the carbon-containing gas is fed into the vacuum vessel 61.

Subsequently, by the agency of the plasma produced in a region between the inner surface 11$b$ of the guide bush 11 and the auxiliary electrode 71, the hard carbon film 15 is formed over the inner surface 11$b$ of the guide bush 11.

With this embodiment, it is possible to inhibit further the occurrence of arc discharge at the moment the plasma discharge starts as in the case of the respective embodiments described above, and to increase a deposition rate of the hard carbon film since only benzene is fed into the vacuum vessel after the stabilization of the plasma.

The effect of operation of this embodiment wherein a positive DC voltage is applied to the auxiliary electrode 71 and the dummy member 53 is employed is the same as that for the fourth embodiment described above.

Now, another embodiment of the invention employing the apparatus shown in FIG. 6 as in the case of the fifth embodiment will be described.

In the same manner as in the case of the fifth embodiment, a guide bush 11, an auxiliary electrode 71, and a dummy member 53 are disposed inside the vacuum vessel 61 as shown in FIG. 6, and the vacuum vessel 61 is then evacuated until the degree of vacuum reaches the initially reached pressure at not higher than $3\times10^{-5}$ torr.

Then, RF power of 250 W is applied to the guide bush 11 from an RF power source 69 at an oscillation frequency of 13.56 MHz via a matching circuit 67 while a DC voltage at +20 V is applied to the auxiliary electrode 71 from an auxiliary electrode power source 83.

Thereafter, a mixed gas of methane ($CH_4$) and argon as a carbon-containing gas is fed into the vacuum vessel 61 through the gas inlet port 63, reglating the pressure in the vacuum vessel 61 to be at a film-forming pressure of 0.5 torr. The ratio of the flow rate of methane to that of argon is set at 50:50 in this case as well.

Then, at a pressure of 0.2 torr, lower than the film-forming pressure of 0.5 torr, plasma discharge is caused to start in a region surrounding the guide bush 11 inside the vacuum vessel 61. With the elapse of 2 minutes after the stabilization of the plasma, only methane as the carbon-containing gas is fed into the vacuum vessel 61.

Thereupon, the hard carbon film 15 is formed over the inner surface 11b of the guide bush 11 by the agency of the plasma produced in a region between the inner surface 11b of the guide bush 11 and the auxiliary electrode 71.

Thus, with this embodiment as well, the same effect of operation as that for the embodiment described above can be obtained.

Still another embodiment of the invention employing the apparatus shown in FIG. 7 as in the case of the sixth embodiment will be described.

After disposing a guide bush 11, an auxiliary electrode 71 and a dummy member 53 are disposed in the vacuum vessel 61 shown in FIG. 7, as in the case of the sixth embodiment, and the vacuum vessel 61 is evacuated until the degree of vacuum reaches an initially reached pressure at not higher than $3 \times 10^{-5}$ torr.

Thereafter, a DC voltage at −450 V is applied to the guide bush 11 from a DC power source 73' while a DC voltage at +20 V is applied to the auxiliary electrode 71 from an auxiliary electrode power source 83.

Subsequently, a mixed gas of methane ($CH_4$) and argon as a carbon-containing gas is fed into the vacuum vessel 61 through the gas inlet port 63, regulating the degree of vacuum in the vacuum vessel 61 to be at a film-forming pressure of 0.5 torr. The ratio of the flow rate of methane to that of argon is set at 50:50 in this case as well.

Then, at a pressure of 0.1 torr, lower than the film-forming pressure of 0.5 torr, plasma discharge is caused to start in a region surrounding the guide bush 11 inside the vacuum vessel 61. With the elapse of 2 minutes after the stabilization of the plasma, only methane as the carbon-containing gas is fed into the vacuum vessel 61.

Thereupon, the hard carbon film 15 is formed over the inner surface of the guide bush 11 by the agency of the plasma produced in a region between the inner surface 11b of the guide bush 11 and the auxiliary electrode 71.

Thus, with this embodiment as well, the same effect of operation as that for the embodiment described above can be obtained.

As in the cases of the foregoing embodiments, the method of forming the hard carbon film, thereby producing a plasma by feeding a mixed gas of argon and either benzene or methane as a carbon-containing gas into the vacuum vessel, and feeding only benzene or methane after the stabilization of the plasma, may be carried out using the apparatus used in the first to third embodiments, respectively, as shown in FIGS. 1 to 3, respectively.

In the aforesaid embodiments of the method of forming the hard carbon film according to the invention, use of methane gas or benzene gas as a carbon-containing gas has been described by way of example. However, a carbon-containing gas other than methane gas, such as ethylene gas, or vapor of a carbon-containing liquid such as hexane may be used instead.

In the respective embodiments of the invention described hereinbefore, the hard carbon film is formed over both the outer and inner surfaces of the guide bush 11. However, it is possible to form the hard carbon film over only the inner surface 11b thereof.

For that purpose, a covering member may be disposed over the outer surface of the guide bush 11, and a simple means for achieving such an object may be to wrap the outer surface of the guide bush 11 with aluminum foil.

INDUSTRIAL APPLICABILITY

As is evident from the foregoing description, with the use of the method of forming the hard carbon film according to the invention, it has become possible to preclude occurrence of an unintended discharge such as arc discharge at the moment plasma discharge starts so that the hard carbon film can have improved adhesion.

Further, as the plasma CVD process is applied with the auxiliary electrode inserted in the center bore of the guide bush, it is possible to preclude an unintended discharge such as hollow discharge. This also contributes to the formation of a hard carbon film having excellent adherence over the inner surface of the guide bush.

In addition, it is possible to form a hard carbon film uniform in thickness throughout the inner surface of the guide bush.

Hence, with the use of the guide bush provided with the hard carbon film formed over the inner surface thereof by the method according to the present invention mounted on an automatic lathe, it has become possible to inhibit wear of the inner surface of the guide bush, coming in contact with workpieces, and to prevent occurrence of damage to the workpieces and seizure occurring between the guide bush and the workpieces even if heavy-load machining is performed at a high cutting speed.

What is claimed is:

1. A method of forming a diamond-like carbon (DLC) film over an inner surface of a guide bush comprising:
    a first step of placing the guide bush for use in an automatic lathe in a vacuum vessel having an evacuation port and a gas inlet port, and provided with an anode and a filament therein, and inserting an auxiliary electrode, which is grounded or to which a positive DC voltage is applied, in a center bore of the guide bush, defined by the inner surface thereof, coming in sliding contact with a workpiece;
    a second step of evacuating the vacuum vessel such that an initially reached pressure therein is not higher than a predetermined degree of vacuum;
    a third step of applying a DC voltage to the anode and an AC voltage to the filament while applying a DC voltage to the guide bush; and
    a fourth step of supplying carbon-containing gas into the vacuum vessel through the gas inlet port, producing a plasma therein and controlling a pressure inside the vacuum vessel to attain a film-forming pressure higher than the initially reached pressure while forming the diamond-like carbon (DLC) film over the inner surface of the guide bush by means of a plasma CVD process.

2. A method of forming a diamond-like carbon (DLC) film over an inner surface of a guide bush comprising:
    a first step of placing the guide bush for use in an automatic lathe in a vacuum vessel having an evacuation port and a gas inlet port, and inserting an auxiliary electrode, which is grounded or to which positive DC voltage is applied, in a center bore of the guide bush defined by the inner surface thereof, coming in sliding contact with a workpiece;

a second step of evacuating the vacuum vessel such that an initially reached pressure therein is not higher than a predetermined degree of vacuum;

a third step of applying RF power to the guide bush; and a fourth step of supplying carbon-containing gas into the vacuum vessel through the gas inlet port, producing a plasma therein and controlling a pressure inside the vacuum vessel to attain a film-forming pressure higher than the initially reached pressure while forming the diamond-like carbon (DLC) film over the inner surface of the guide bush by means of a plasma CVD process.

3. A method of forming a diamond-like carbon (DLC) film over an inner surface of a guide bush comprising:

a first step of placing the guide bush for use in an automatic lathe in a vacuum vessel having an evacuation port and a gas inlet port, and inserting an auxiliary electrode, which is grounded or to which positive DC voltage is applied, in a center bore of the guide bush, defined by the inner surface thereof, coming in sliding contact with a workpiece;

a second step of evacuating the vacuum vessel such that an initially reached pressure therein is not higher than a predetermined degree of vacuum;

a third step of applying a DC voltage to the guide bush; and a fourth step of supplying carbon-containing gas into the vacuum vessel through the gas inlet port, producing a plasma therein and controlling a pressure inside the vacuum vessel to attain a film-forming pressure higher than the initially reached pressure while forming the diamond-like carbon (DLC) film over the inner surface of the guide bush by means of a plasma CVD process.

4. A method of forming a diamond-like carbon (DLC) film over the inner surface of a guide bush according to claim 1, wherein the carbon-containing gas fed into the vacuum vessel in the fourth step is methane or benzene.

5. A method of forming a diamond-like carbon (DLC) film over the inner surface of a guide bush according to claim 1, wherein the carbon-containing gas fed into the vacuum vessel in the fourth step is a mixed gas of argon and either methane or benzene.

6. A method of forming a diamond-like carbon (DLC) film over the inner surface of a guide bush according to claim 1, wherein a mixed gas of argon and either methane or benzene is fed into the vacuum vessel as the carbon-containing gas in the initial stage of the fourth step, producing a plasma, and then only methane gas or benzene gas is fed into the vacuum vessel after stabilization of the plasma.

7. A method of forming a diamond-like carbon (DLC) film over the inner surface of a guide bush according to claim 2, wherein the carbon-containing gas fed into the vacuum vessel in the fourth step is methane or benzene.

8. A method of forming a diamond-like carbon (DLC) film over the inner surface of a guide bush according to claim 2, wherein the carbon-containing gas fed into the vacuum vessel in the fourth step is a mixed gas of argon and either methane or benzene.

9. A method of forming a diamond-like carbon (DLC) film over the inner surface of a guide bush according to claim 2, wherein a mixed gas of argon and either methane or benzene is fed into the vacuum vessel as the carbon-containing gas in the initial stage of the fourth step, producing a plasma, and then only methane gas or benzene gas is fed into the vacuum vessel after stabilization of the plasma.

10. A method of forming a diamond-like carbon (DLC) film over the inner surface of a guide bush according to claim 3, wherein the carbon-containing gas fed into the vacuum vessel in the fourth step is methane or benzene.

11. A method of forming a diamond-like carbon (DLC) film over the inner surface of a guide bush according to claim 3, wherein the carbon-containing gas fed into the vacuum vessel in the fourth step is a mixed gas of argon and either methane or benzene.

12. A method of forming a diamond-like carbon (DLC) film over the inner surface of a guide bush according to claim 3, wherein a mixed gas of argon and either methane, or benzene is fed into the vacuum vessel as the carbon-containing gas in the initial stage of the fourth step, producing a plasma, and then only methane gas or benzene gas is fed into the vacuum vessel after stabilization of the plasma.

* * * * *